(12) United States Patent
Tucholski

(10) Patent No.: US 8,734,980 B2
(45) Date of Patent: May 27, 2014

(54) ELECTRICAL DEVICE-BATTERY ASSEMBLY AND THE METHOD TO MAKE THE SAME

(75) Inventor: Gary R. Tucholski, North Royalton, OH (US)

(73) Assignee: Blue Spark Technologies, Inc., Westlake, OH (US)

( * ) Notice: Subject to any disclaimer, the term of this patent is extended or adjusted under 35 U.S.C. 154(b) by 0 days.

(21) Appl. No.: 13/455,308

(22) Filed: Apr. 25, 2012

(65) Prior Publication Data

US 2012/0206887 A1   Aug. 16, 2012

Related U.S. Application Data

(62) Division of application No. 11/379,816, filed on Apr. 24, 2006.

(60) Provisional application No. 60/678,726, filed on May 6, 2005, provisional application No. 60/760,242, filed on Jan. 19, 2006.

(51) Int. Cl.
*H01M 6/46* (2006.01)
*H01M 2/08* (2006.01)
*H01M 4/62* (2006.01)
*H01M 2/16* (2006.01)
*H01M 4/50* (2010.01)
*H01M 4/66* (2006.01)

(52) U.S. Cl.
USPC ........... 429/162; 429/163; 429/185; 429/246; 429/217; 429/224; 429/245

(58) Field of Classification Search
None
See application file for complete search history.

(56) References Cited

U.S. PATENT DOCUMENTS

| | | | |
|---|---|---|---|
| 629,325 | A | 7/1899 | Ashley |
| 629,372 | A | 7/1899 | Kennedy |
| 2,154,312 | A | 4/1939 | MacCallum |
| 2,480,531 | A | 8/1949 | Wilke |
| 2,637,757 | A | 5/1953 | Wilke |
| 2,688,649 | A | 9/1954 | Bjorksten |
| 2,903,498 | A | 9/1959 | Sindel et al. |
| 2,905,738 | A | 9/1959 | Di Pasquale et al. |
| 3,006,980 | A | 10/1961 | Story |

(Continued)

FOREIGN PATENT DOCUMENTS

| | | |
|---|---|---|
| DE | 19943961 A1 | 6/2000 |
| EP | 0678927 A1 | 10/1995 |

(Continued)

OTHER PUBLICATIONS

Acheson Colloids Company, "Sales Information Bulletin," Port Huron, MI.

(Continued)

*Primary Examiner* — Barbara Gilliam
*Assistant Examiner* — Angela Martin
(74) *Attorney, Agent, or Firm* — Pearne & Gordon LLP

(57) ABSTRACT

Printed electronics are increasingly becoming an important industry, thus innovations to integrate the various components and processes would be very useful to expand this industry. Disclosed are innovational concepts that would be very useful to accelerate this industry. Webs of printed electronics, antennas, power sources (cells/batteries), and assembly substrates can be merged together to form a completed electronic assembly that could be, for example, in label form or in a stand alone electronic device.

20 Claims, 9 Drawing Sheets

(56) References Cited

U.S. PATENT DOCUMENTS

| | | |
|---|---|---|
| 3,230,115 A | 1/1966 | Tamminen |
| 3,375,136 A | 3/1968 | Biggar |
| 3,655,449 A | 4/1972 | Yamamoto et al. |
| 3,770,504 A | 11/1973 | Bergum |
| 3,799,808 A | 3/1974 | Hancock |
| 3,847,669 A | 11/1974 | Paterniti |
| 3,901,732 A | 8/1975 | Kalnoki Kis et al. |
| 3,928,077 A | 12/1975 | Sperandio et al. |
| 3,954,506 A | 5/1976 | Sullivan |
| 3,967,292 A | 6/1976 | Delahunt |
| 3,980,497 A | 9/1976 | Gillman et al. |
| 3,988,168 A | 10/1976 | Bruneau |
| 3,993,508 A | 11/1976 | Erlichman |
| 4,001,467 A | 1/1977 | Sullivan |
| 4,006,036 A | 2/1977 | Charkoudian |
| 4,007,472 A | 2/1977 | Land |
| 4,028,479 A | 6/1977 | Fanciullo et al. |
| 4,042,760 A | 8/1977 | Land |
| 4,047,289 A | 9/1977 | Wolff |
| 4,060,669 A | 11/1977 | Fanciullo |
| 4,070,528 A | 1/1978 | Bergum et al. |
| 4,080,728 A | 3/1978 | Buckler |
| 4,086,399 A | 4/1978 | Hyland et al. |
| 4,086,400 A | 4/1978 | Hyland et al. |
| 4,098,965 A | 7/1978 | Kinsman |
| 4,105,815 A | 8/1978 | Buckler |
| 4,105,831 A | 8/1978 | Plasse |
| 4,112,205 A | 9/1978 | Charkoudian et al. |
| 4,118,860 A | 10/1978 | Buckler et al. |
| 4,119,770 A | 10/1978 | Land |
| 4,124,742 A | 11/1978 | Land et al. |
| 4,125,684 A | 11/1978 | Land |
| 4,125,685 A | 11/1978 | Bloom et al. |
| 4,125,686 A | 11/1978 | Kinsman |
| 4,136,236 A | 1/1979 | Ruetschi |
| 4,137,627 A | 2/1979 | Kinsman |
| 4,145,485 A | 3/1979 | Kinsman |
| 4,150,200 A | 4/1979 | Sullivan |
| 4,152,825 A | 5/1979 | Bruneau |
| 4,172,184 A | 10/1979 | Bloom et al. |
| 4,172,319 A | 10/1979 | Bloom et al. |
| 4,175,052 A | 11/1979 | Norteman, Jr. |
| 4,177,330 A | 12/1979 | Gordon et al. |
| 4,177,552 A | 12/1979 | Gordon et al. |
| 4,181,778 A | 1/1980 | Land |
| 4,185,144 A | 1/1980 | Ames et al. |
| 4,194,061 A | 3/1980 | Land et al. |
| 4,195,121 A | 3/1980 | Peterson |
| 4,204,036 A | 5/1980 | Cohen et al. |
| 4,232,099 A | 11/1980 | Sullivan |
| 4,242,424 A | 12/1980 | Buckler et al. |
| 4,254,191 A | 3/1981 | Kniazzeh |
| 4,256,813 A | 3/1981 | Kniazzeh |
| 4,287,274 A | 9/1981 | Ibbotson et al. |
| 4,345,954 A | 8/1982 | Panchu |
| 4,361,633 A | 11/1982 | Nel et al. |
| 4,389,470 A | 6/1983 | Plasse |
| 4,400,452 A | 8/1983 | Bruder |
| 4,427,748 A | 1/1984 | Land |
| 4,429,026 A | 1/1984 | Bruder |
| 4,455,358 A | 6/1984 | Graham et al. |
| 4,466,470 A | 8/1984 | Bruder |
| 4,477,544 A | 10/1984 | Bruder |
| 4,502,903 A | 3/1985 | Bruder |
| 4,505,996 A | 3/1985 | Simonton |
| 4,525,439 A | 6/1985 | Simonton |
| 4,532,193 A | 7/1985 | Kniazzeh et al. |
| 4,539,275 A | 9/1985 | Plasse |
| 4,554,226 A | 11/1985 | Simonton |
| 4,604,334 A | 8/1986 | Tarascon |
| 4,608,279 A | 8/1986 | Schumm, Jr. |
| 4,609,597 A | 9/1986 | Plasse |
| 4,621,035 A | 11/1986 | Bruder |
| 4,623,598 A | 11/1986 | Waki et al. |
| 4,664,993 A | 5/1987 | Sturgis et al. |
| 4,756,717 A | 7/1988 | Sturgis et al. |
| 4,889,777 A | 12/1989 | Akuto |
| 4,916,035 A | 4/1990 | Yamashita et al. |
| 4,977,046 A | 12/1990 | Bleszinski, Jr. et al. |
| 4,997,732 A | 3/1991 | Austin et al. |
| 5,035,965 A | 7/1991 | Sangyoji et al. |
| 5,055,968 A | 10/1991 | Nishi et al. |
| 5,110,696 A | 5/1992 | Shokoohi et al. |
| 5,116,701 A | 5/1992 | Kalisz |
| 5,120,785 A | 6/1992 | Walker et al. |
| 5,217,828 A | 6/1993 | Sangyoji et al. |
| 5,259,891 A | 11/1993 | Matsuyama et al. |
| 5,326,652 A | 7/1994 | Lake |
| 5,330,860 A | 7/1994 | Grot et al. |
| 5,350,645 A | 9/1994 | Lake et al. |
| 5,401,590 A | 3/1995 | Chalilpoyil et al. |
| 5,415,888 A | 5/1995 | Banerjee et al. |
| 5,424,151 A | 6/1995 | Koksbang et al. |
| 5,445,856 A | 8/1995 | Chaloner-Gill |
| 5,455,127 A | 10/1995 | Olsen et al. |
| 5,470,357 A | 11/1995 | Schmutz et al. |
| 5,514,492 A | 5/1996 | Marincic et al. |
| 5,547,911 A | 8/1996 | Grot |
| 5,565,143 A | 10/1996 | Chan |
| 5,578,390 A | 11/1996 | Hughen |
| 5,587,254 A | 12/1996 | Kojima et al. |
| 5,620,580 A | 4/1997 | Okabe |
| 5,622,652 A | 4/1997 | Kucherovsky et al. |
| 5,624,468 A | 4/1997 | Lake |
| 5,637,418 A | 6/1997 | Brown et al. |
| 5,652,043 A | 7/1997 | Nitzan |
| 5,658,684 A | 8/1997 | Lake |
| 5,728,181 A | 3/1998 | Jung et al. |
| 5,735,912 A | 4/1998 | Lake |
| 5,735,914 A | 4/1998 | Lake |
| 5,747,190 A | 5/1998 | Lake |
| 5,747,191 A | 5/1998 | Lake |
| 5,759,215 A | 6/1998 | Masuda |
| 5,779,839 A | 7/1998 | Tuttle et al. |
| 5,811,204 A | 9/1998 | Nitzan |
| 5,865,859 A | 2/1999 | Lake |
| 5,897,522 A | 4/1999 | Nitzan |
| 5,906,661 A | 5/1999 | Lake |
| 5,930,023 A | 7/1999 | Mitchell, Jr. et al. |
| 5,941,844 A | 8/1999 | Eckenhoff |
| 6,025,089 A | 2/2000 | Lake |
| 6,030,423 A | 2/2000 | Lake |
| 6,030,721 A | 2/2000 | Lake |
| 6,045,942 A | 4/2000 | Miekka et al. |
| 6,078,842 A | 6/2000 | Gross et al. |
| 6,084,380 A | 7/2000 | Burton |
| RE36,843 E | 8/2000 | Lake |
| 6,136,468 A | 10/2000 | Mitchell et al. |
| 6,157,858 A | 12/2000 | Gross et al. |
| 6,186,982 B1 | 2/2001 | Gross et al. |
| 6,187,475 B1 | 2/2001 | Oh et al. |
| 6,200,704 B1 | 3/2001 | Katz et al. |
| 6,208,524 B1 * | 3/2001 | Tuttle .................. 361/782 |
| 6,235,422 B1 | 5/2001 | Kaplan et al. |
| 6,243,192 B1 | 6/2001 | Mitchell, Jr. et al. |
| 6,273,904 B1 | 8/2001 | Chen et al. |
| 6,277,520 B1 | 8/2001 | Moutsios et al. |
| 6,317,630 B1 | 11/2001 | Gross et al. |
| 6,369,793 B1 | 4/2002 | Parker |
| 6,379,835 B1 | 4/2002 | Kucherovsky et al. |
| 6,395,043 B1 | 5/2002 | Shadle et al. |
| 6,421,561 B1 | 7/2002 | Morris |
| 6,458,234 B1 | 10/2002 | Lake et al. |
| 6,503,658 B1 | 1/2003 | Klein et al. |
| 6,569,572 B1 | 5/2003 | Ochiai et al. |
| 6,576,364 B1 | 6/2003 | Mitchell, Jr. et al. |
| 6,643,532 B2 | 11/2003 | Axelgaard |
| 6,653,014 B2 | 11/2003 | Anderson et al. |
| 6,664,006 B1 | 12/2003 | Munshi |
| 6,676,021 B1 | 1/2004 | Luski et al. |
| 6,676,714 B2 | 1/2004 | Langan |
| 6,697,694 B2 | 2/2004 | Mogensen |
| 6,708,050 B2 | 3/2004 | Carim |
| 6,709,778 B2 | 3/2004 | Johnson |

(56) References Cited

U.S. PATENT DOCUMENTS

| | | | |
|---|---|---|---|
| 6,729,025 B2 | 5/2004 | Farrell et al. | |
| 6,740,451 B2 | 5/2004 | Christian et al. | |
| 6,743,546 B1 | 6/2004 | Kaneda et al. | |
| 6,752,842 B2 | 6/2004 | Luski et al. | |
| 6,757,560 B1 | 6/2004 | Fischer et al. | |
| 6,816,125 B2 | 11/2004 | Kuhns et al. | |
| 6,836,215 B1* | 12/2004 | Laurash et al. | 340/572.1 |
| 6,855,441 B1 | 2/2005 | Levanon | |
| 6,884,546 B1 | 4/2005 | Fujita et al. | |
| 6,888,502 B2 | 5/2005 | Beigel et al. | |
| 6,899,976 B2 | 5/2005 | Larson et al. | |
| 6,915,159 B1 | 7/2005 | Kuribayashi et al. | |
| 7,017,822 B2 | 3/2006 | Aisenbrey | |
| 7,022,431 B2 | 4/2006 | Shchori et al. | |
| 7,031,768 B2 | 4/2006 | Anderson et al. | |
| 7,043,297 B2 | 5/2006 | Keusch et al. | |
| 7,049,962 B2 | 5/2006 | Atherton et al. | |
| 7,164,384 B2 | 1/2007 | Howard | |
| 7,224,280 B2 | 5/2007 | Ferguson et al. | |
| RE39,676 E | 6/2007 | Nitzan | |
| 7,233,250 B2* | 6/2007 | Forster | 340/572.8 |
| 7,238,196 B2 | 7/2007 | Wibaux | |
| 7,244,326 B2 | 7/2007 | Craig et al. | |
| 7,294,209 B2 | 11/2007 | Shakespeare | |
| 7,320,845 B2 | 1/2008 | Zucker | |
| 7,335,441 B2 | 2/2008 | Luski et al. | |
| 7,340,297 B2 | 3/2008 | Tamarkin et al. | |
| 7,340,310 B2 | 3/2008 | Nitzan et al. | |
| 7,348,096 B2 | 3/2008 | Schubert et al. | |
| 7,364,896 B2 | 4/2008 | Schembri | |
| 7,368,191 B2 | 5/2008 | Andelman et al. | |
| 7,383,083 B2 | 6/2008 | Fischer et al. | |
| 7,394,382 B2 | 7/2008 | Nitzan et al. | |
| 7,461,613 B2 | 12/2008 | Sinclair et al. | |
| 7,483,738 B2 | 1/2009 | Tamarkin et al. | |
| 7,491,465 B2 | 2/2009 | Nitzan et al. | |
| 7,501,208 B2 | 3/2009 | Feddrix et al. | |
| 7,599,192 B2 | 10/2009 | Pennaz et al. | |
| 7,603,144 B2 | 10/2009 | Jenson et al. | |
| 7,625,664 B2 | 12/2009 | Schubert et al. | |
| 7,643,874 B2 | 1/2010 | Nitzan et al. | |
| 7,652,188 B2 | 1/2010 | Levanon et al. | |
| 7,727,290 B2 | 6/2010 | Zhang et al. | |
| 2002/0086215 A1 | 7/2002 | Tamura et al. | |
| 2002/0095780 A1 | 7/2002 | Shadle et al. | |
| 2002/0110733 A1 | 8/2002 | Johnson | |
| 2002/0182485 A1 | 12/2002 | Anderson et al. | |
| 2002/0192542 A1 | 12/2002 | Luski et al. | |
| 2003/0014014 A1 | 1/2003 | Nitzan | |
| 2003/0059673 A1 | 3/2003 | Langan et al. | |
| 2003/0082437 A1 | 5/2003 | Sotomura | |
| 2003/0130015 A1 | 7/2003 | McTaggart | |
| 2003/0165744 A1 | 9/2003 | Schubert et al. | |
| 2003/0187338 A1 | 10/2003 | Say et al. | |
| 2003/0219648 A1 | 11/2003 | Zucker | |
| 2004/0001998 A1 | 1/2004 | Hopkins et al. | |
| 2004/0018422 A1 | 1/2004 | Islam et al. | |
| 2004/0170893 A1 | 9/2004 | Nakaishi et al. | |
| 2004/0209160 A1 | 10/2004 | Luski et al. | |
| 2004/0217865 A1 | 11/2004 | Turner | |
| 2004/0267189 A1 | 12/2004 | Mavor et al. | |
| 2004/0267190 A1 | 12/2004 | Tamarkin et al. | |
| 2004/0267283 A1 | 12/2004 | Mavor et al. | |
| 2005/0013783 A1 | 1/2005 | Perricone | |
| 2005/0038473 A1 | 2/2005 | Tamarkin et al. | |
| 2005/0085751 A1 | 4/2005 | Daskal et al. | |
| 2005/0147880 A1 | 7/2005 | Takahashi et al. | |
| 2005/0194454 A1 | 9/2005 | Ferber et al. | |
| 2005/0260492 A1* | 11/2005 | Tucholski et al. | 429/185 |
| 2006/0001528 A1 | 1/2006 | Nitzan et al. | |
| 2006/0007049 A1 | 1/2006 | Nitzan et al. | |
| 2006/0012464 A1 | 1/2006 | Nitzan et al. | |
| 2006/0087432 A1 | 4/2006 | Corbett, Jr. | |
| 2006/0131616 A1 | 6/2006 | Devaney et al. | |
| 2006/0146271 A1 | 7/2006 | Pennaz et al. | |
| 2006/0159899 A1 | 7/2006 | Edwards et al. | |
| 2006/0211936 A1 | 9/2006 | Hu et al. | |
| 2006/0216586 A1 | 9/2006 | Tucholski | |
| 2006/0253061 A1 | 11/2006 | Anderson et al. | |
| 2006/0264804 A1 | 11/2006 | Karmon et al. | |
| 2007/0007661 A1 | 1/2007 | Burgess et al. | |
| 2007/0011870 A1 | 1/2007 | Lerch et al. | |
| 2007/0016277 A1 | 1/2007 | Karat et al. | |
| 2007/0024425 A1 | 2/2007 | Nitzan et al. | |
| 2007/0060862 A1 | 3/2007 | Sun et al. | |
| 2007/0066930 A1 | 3/2007 | Tanioka et al. | |
| 2007/0243459 A1 | 10/2007 | Jenson et al. | |
| 2008/0007409 A1 | 1/2008 | Ferry et al. | |
| 2008/0021436 A1 | 1/2008 | Wolpert et al. | |
| 2008/0091095 A1 | 4/2008 | Heller et al. | |
| 2008/0174380 A1 | 7/2008 | Nitzan et al. | |
| 2008/0202490 A1* | 8/2008 | Dodo | 126/263.07 |
| 2008/0218345 A1 | 9/2008 | Nitzan et al. | |
| 2008/0272890 A1 | 11/2008 | Nitzan et al. | |
| 2010/0209756 A1* | 8/2010 | Bailey et al. | 429/124 |
| 2011/0136249 A1* | 6/2011 | Stiene | 436/164 |

FOREIGN PATENT DOCUMENTS

| | | |
|---|---|---|
| EP | 0862227 A1 | 9/1998 |
| EP | 1026767 A1 | 8/2000 |
| EP | 1096589 A1 | 5/2001 |
| EP | 1107336 A2 | 6/2001 |
| JP | 55-133770 A | 10/1980 |
| JP | 58-206048 A | 12/1983 |
| JP | 59-228353 A | 12/1984 |
| JP | 61-55866 A | 3/1986 |
| JP | 61-64077 A | 4/1986 |
| JP | 62-126557 A | 6/1987 |
| JP | 62-165875 A | 7/1987 |
| JP | 62-165876 A | 7/1987 |
| JP | 62-285954 A | 12/1987 |
| JP | 63-119155 A | 5/1988 |
| JP | 64-24364 A | 1/1989 |
| JP | 05-217587 * 8/1993 | H01M 6/40 |
| JP | 5-217587 A | 8/1993 |
| JP | 5-225989 A | 9/1993 |
| JP | 5-275087 A | 10/1993 |
| JP | 2000-164033 A | 6/2000 |
| JP | 2000-229128 A | 8/2000 |
| JP | 2000-319381 A | 11/2000 |
| JP | 2001-23695 A | 1/2001 |
| JP | 2004-336240 A | 11/2004 |
| JP | 2005-39256 A | 2/2005 |
| TW | 540185 B | 7/2003 |
| WO | 96/38867 A1 | 12/1996 |
| WO | 97/17735 A1 | 5/1997 |
| WO | 98/22987 A2 | 5/1998 |
| WO | 00/36672 A1 | 6/2000 |
| WO | 03/069700 A2 | 8/2003 |
| WO | 2006/003648 A2 | 1/2006 |
| WO | WO 2006-003648 * 1/2006 | |

OTHER PUBLICATIONS

Acheson Industries, "Acheson Electrical Materials," Henkel Corporation, One Henkel Way, Rocky Hill, CT 06067, retrieved Nov. 24, 2009 from www.achesonindustries.com.

Advanced Coatings and Chemicals, "Technical Data Sheet," Temple City, CA.

Linden, D., Handbook of Batteries and Fuel Cells, McGraw-Hill Book Company, 1984, pp. 5-5 to 5-7.

Linden, D., Handbook of Batteries Second Edition, McGraw-Hill, Inc., 1995, pp. 8.8 to 8.9.

Omnexus Adhesives & Sealant Solutions, "Ethylene Vinyl Acetate (EVA) and Other Hot Melts," from http://www.omnexus4adhesives.com/bc/construction-channel/index.aspx?id=ethylene.

International Search Report and Written Opinion issued Dec. 31, 2008 in PCT Application Serial No. PCT/U2008/070500.

International Search Report and Written Opinion issued Jan. 30, 2009 in PCT Application Serial No. PCT/US2008/071549.

International Search Report and Written Opinion issued Aug. 6, 2009 in PCT Application Serial No. PCT/US2008/087424.

(56) References Cited

OTHER PUBLICATIONS

Prosecution history for U.S. Appl. No. 11/110,202.
Prosecution history for U.S. Appl. No. 11/378,520.
Prosecution history for U.S. Appl. No. 12/669,067.
Prosecution history for U.S. Appl. No. 12/669,068.
Hartman, Lauren R., "Flexibles stay resilient," Packaging Digest, Mar. 1, 2005.

* cited by examiner

ELECTRICAL DEVICE-BATTERY ASSEMBLY AND THE METHOD TO MAKE THE SAME

CROSS-REFERENCES TO RELATED APPLICATIONS

This application is a divisional of application Ser. No. 11/379,816, filed on Apr. 24, 2006, which claims the benefit of provisional application Ser. No. 60/678,726, filed on May 6, 2005, and 60/760,242, filed on Jan. 19, 2006, all of which are incorporated herein by reference.

BACKGROUND OF THE INVENTION

In recent years, there has been a growing need for active RFID antennas and/or sensors with RFID antennas. However, the current applications of such devices often require the expensive hand assembly of cells/batteries with RFID applications and extra hardware to make the connections when coin or button cells are used. A means of reducing or eliminating the need for such manual processes would be useful.

Furthermore, improvements in flat battery cell designs are progressing, and thus a means of utilizing such flat cells in RFID and other applications would also be useful.

In addition, a method for allowing manufacturers to integrate the printing of the required circuitry of electrical components while mating components to a battery to power the components would be useful. Ultimately integrating the printing and assembly of cells and/or batteries with the printing of circuitry and/or the antenna would also be useful. Furthermore, a method of manufacturing integrated devices that would help reduce or eliminate expensive hand assembly of cells/batteries with RFID applications and extra hardware would be useful.

SUMMARY OF INVENTION

Provided are a plurality of embodiments of the invention, including, but not limited to, an electrical device comprising an electrical apparatus including: an apparatus substrate having a first side and a second side, an electrical component provided on the first side of the apparatus substrate, a first electrical contact electrically connected to the electrical component and provided on the second side of the apparatus substrate, and a second electrical contact electrically connected to the electrical component and provided on the second side of the apparatus substrate.

The flat battery of the above device includes at least one electrochemical cell, the battery having a first side and a second side, with the first side of the battery fixedly connected to the second side of the apparatus substrate, wherein the battery is for providing electrical energy to the electrical apparatus.

The battery also includes: a first electrode contact connected to the first electrical contact, and a second electrode contact connected to the second electrical contact; a flexible substrate; and an adhesive for mounting the second side of the battery to the flexible substrate.

Also provided is a roll comprising a plurality of electrical devices provided on a flexible substrate. Each of the electrical devices further comprises: an electrical apparatus and a flat battery.

The electrical apparatus includes: an apparatus substrate, an electrical component provided on the apparatus substrate layer, a first electrical contact electrically connected to the electrical component, and a second electrical contact electrically connected to the electrical component.

The flat battery includes at least one electrochemical cell for providing electrical energy to the electrical apparatus, and the flat battery also includes: a first electrode contact connected to the first electrical contact, and a second electrode contact connected to the second electrical contact, wherein the electrical apparatus and the flat battery are connected together to form the electrical device; and a flexible substrate.

The plurality of electrical devices are distributed on the flexible substrate in a manner which allows the flexible substrate with the electrical devices to be formed into the roll such that the roll can be unwound to provide access to each of the plurality of electrical devices.

Still further provided is a roll comprising a plurality of electrical devices provided on a flexible substrate, each of the electrical devices further comprising an electrical apparatus and a flat, flexible battery fixedly mounted on the second side of the apparatus substrate using an adhesive to discretely form the electrical device, the battery for providing electrical energy to the electrical apparatus.

The electrical apparatus includes: an apparatus substrate having a first side and a second side, an electrical component provided on the first side of the apparatus substrate layer, a first electrical contact provided on the second side of the apparatus substrate, the first electrical contact being electrically connected to the electrical component, and a second electrical contact provided on the second side of the apparatus substrate, the second electrical contact being electrically connected to the electrical component.

The flat battery comprises at least one electrochemical cell including: a first electrochemical layer including an ink, and a second electrochemical layer.

The battery further comprises: a first electrode contact connected to the electrochemical layer and the first electrical contact, and a second electrode contact connected to the second electrical contact; and a flexible substrate having an adhesive on a first side and an adhesive covered with a release liner on a second side.

The battery further comprises: the plurality of electrical devices being fixedly distributed on the first side of the flexible substrate using the adhesive, the distribution being in a linear manner one after another and allowing the flexible substrate with the electrical devices to be formed into the roll such that the roll can be unwound to provide access to each of the plurality of electrical devices in turn.

Also provided are methods for manufacturing the above devices or rolls, or other devices or rolls. One method of manufacturing a roll of a plurality of electrical devices comprises the steps of:
  providing a roll of a plurality of electrical apparatuses each provided on a first side of a first web acting as a substrate of the electrical apparatuses, the first web having the first side and a second side;
  providing a roll of a plurality of flat cells each provided on a first side of a second web acting as a substrate of the cells;
  providing a roll of a third web of a flexible substrate having a first surface with an adhesive layer thereon;
  integrating each one of the electrical apparatuses with a corresponding at least one of the cells to form one of the electrical devices, the integrating including the steps of:
  unwinding the roll of electrical apparatuses, while also unwinding the roll of cells, and while also unwinding the roll of flexible substrate;
  for each one of the electrical apparatuses unwound from the roll of electrical apparatuses, fixedly mounting the one of the electrical apparatuses to a corresponding at least one of the cells unwound from the roll of cells, such that the one of the electrical apparatus is electrically connected to the corresponding at least one of the cells to form one of the electrical devices, and thereby forming the plurality of electrical devices;

fixing each one of the plurality of electrical devices onto the third web, the fixing including the step of fixedly mounting each of the cells on the roll of flexible substrate using the adhesive layer; and winding the third web having the electrical devices mounted thereon into a roll, thereby forming the roll of electrical devices.

Further provided is method of manufacturing a roll of a plurality of electrical devices with the method comprising the steps of:

providing a roll of a plurality of electrical apparatuses each provided on a first side of a first web acting as a substrate of the electrical apparatuses, the first web having the first side and a second side;

providing a roll of a plurality of flat cells each provided on a first side of a second web acting as a substrate of the cells;

providing a roll of a third web of a flexible substrate having a first surface with an adhesive layer thereon;

integrating each one of the electrical apparatuses with a corresponding at least one of the cells to form one of the electrical devices, the integrating including the steps of:

unwinding the roll of electrical apparatuses, while also unwinding the roll of cells, and while also unwinding the roll of flexible substrate;

for each one of the electrical apparatuses unwound from the roll of electrical apparatuses, fixedly mounting the one of the electrical apparatuses to a corresponding at least one of the cells unwound from the roll of cells, such that the one of the electrical apparatus is electrically connected to the corresponding at least one of the cells to form one of the electrical devices, and thereby forming the plurality of electrical devices;

fixing each one of the plurality of electrical devices onto the third web, the fixing including the step of fixedly mounting each of the cells on the roll of flexible substrate using the adhesive layer; and winding the third web having the electrical devices mounted thereon into a roll, thereby forming the roll of electrical devices.

Further provided are any of the above methods, devices, or rolls where the battery is comprised of a single electrochemical cell, or a plurality of electrochemical cells connected in series, in parallel, or some combination thereof.

Also provided are additional embodiments, some, but not all of which, are described hereinbelow.

BRIEF DESCRIPTION OF THE DRAWINGS

The foregoing and other features and advantages of the present invention will become apparent to those skilled in the art to which the present invention relates upon reading the following description with reference to the accompanying drawings, in which.

DETAILED DESCRIPTION OF THE PREFERRED EMBODIMENTS OF THE INVENTION

Generally, the invention is a method creating an electrical device by combining an electrical apparatus with one or more cells/batteries to power the apparatus. The apparatus and a battery of one or more unit cells are typically mounted on a continuous, flexible substrate and formed into a roll. The individual devices can be removed from the roll, such as one at a time. This can be facilitated by perforating the flexible substrate, for example. The apparatus can include one or more electrical components, such as an antenna and/or a processor, for example. The multiple facets of this invention could be used in the total package described and/or they could be used individually or in any combination.

The invention can utilize one or more rolls of a substrate web for the flexible substrate. The web may have a pressure sensitive adhesive on one or both sides. Also utilized can be one or more rolls of cells or multi-cell batteries, which may be of the thin cell type, such as disclosed in co-pending application Ser. No. 11/110,202, filed on Apr. 20, 2005 and incorporated herein by reference, and/or the cells disclosed in co-pending application Ser. No. 11/378,520, filed on Mar. 17, 2006, and also incorporated herein by reference. Further utilized can be one or more rolls of said electrical apparatuses, which may include printed circuitry forming, for example, an RFID device or some other device.

The method/device can be used to integrate these components into rolls of powered devices in a mass-produced manner. The method can provide the battery contacts with a conductive ink on the backside or the front side of a substrate on the printed circuitry. The integrated device can then be formed, if desired, into a roll of finished product where individual ones of said devices can be removed and utilized as needed.

The conductive ink could be based on many types of conductive materials such as carbon, silver, nickel, silver coated copper, copper and/or mixtures of these. One such material that shows useful properties in terms of conductivity and flexibility is Acheson Colloids (Port Huron, Mich.) PM046. Furthermore, many antennas that might be part of the printed circuitry can be made by etching aluminum, copper or similar type metallic foils that are laminated on a polymer such as Kapton substrate. This could be done with many types (frequencies) of antennas whether they are etched or printed. As will be shown in this discussion, this could be especially beneficial for the etched foil antennas, among others.

FIGS. 1-4 show an example printed circuit that could be used for the electrical apparatus of the invention, such as, for example, a copper foil 13.56 MHz antenna design on, for example, a Kapton substrate. The antenna could be of any acceptable frequency size and/or shape and it could be made of any type metallic foil, or even printed with conductive inks such as silver, for example.

Figure 1:
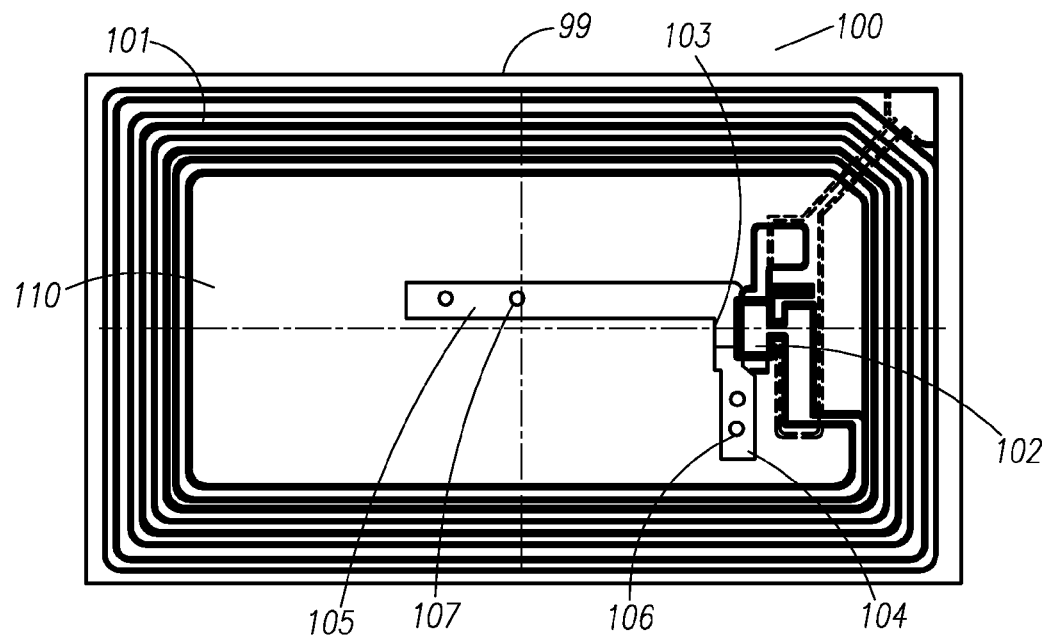
FIG. 1 Shows a drawing of a foil antenna on Kapton.

FIG. 1 shows a top side 99 of an electrical apparatus 100 including an RFID antenna and chip assembly including antenna coils 101, a IC chip 102 that requires a power source and could also include a time/temperature sensor, and/or many other features and circuitry 103 that may be necessary for an active RFID application, possibly including a negative contact 104 and a positive contact 105, for a power source (not shown), all of which can be located on top of substrate 110, which may be of Kapton, for example. The power source negative contact 104 as well as the positive contact 105 may include through-holes 106 and 107, respectively, to make contact to the power source, which can be a battery that can be fastened on the back side of the antenna substrate.

For example, a 3 volt battery can be used by connecting two 1.5 volt unit cells in series, although other voltages and/or currents can be obtained by using unit cells with different voltages and/or by combining different numbers of cells together either in series and/or in parallel. Thus, applications requiring greater voltages can connect unit cells in series, whereas applications requiring greater currents can connect unit cells in parallel, and applications requiring both can utilize groups of cells connected in series further connected in parallel. Thus, a variety of applications that require different voltages and currents can be supported using a variety of unit cell and/or battery configurations.

Figure 2:
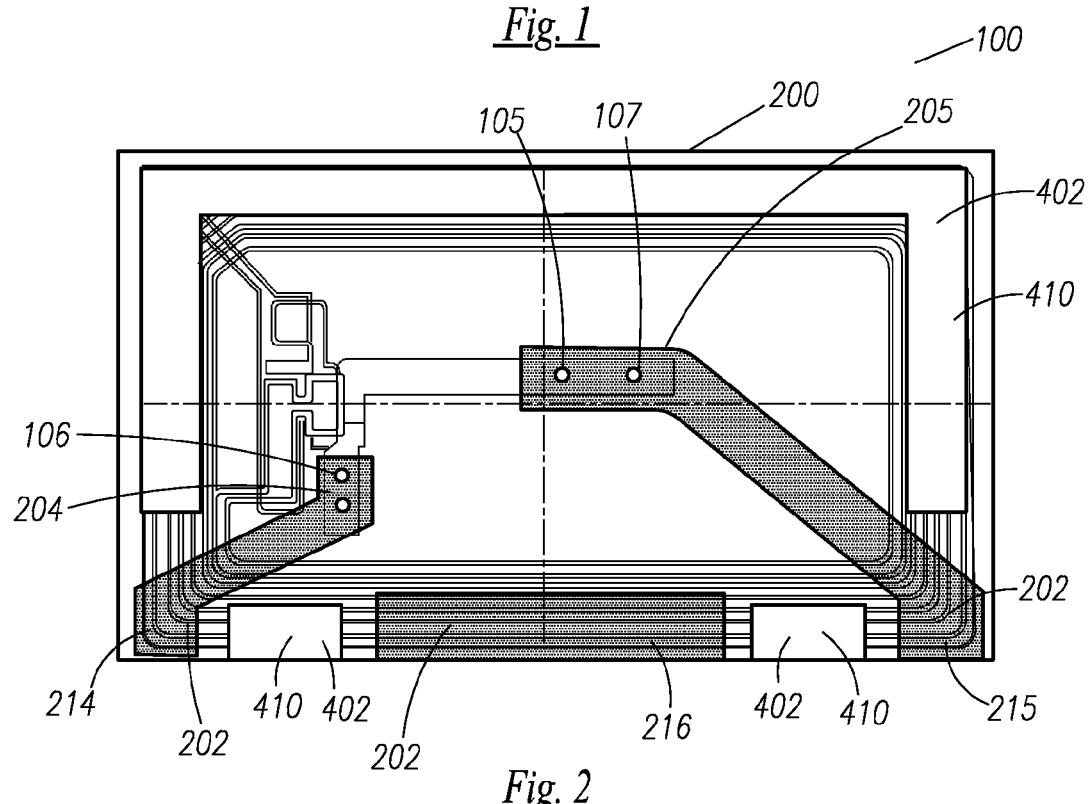
FIG. 2 Shows a drawing of a printed power source circuit on backside of foil antenna.

FIG. 2 shows a back side 200 of the electrical apparatus 100. On the backside 200, power source circuitry 202 can be printed, for example, with a conductive ink, such as an ink including silver, for example. This circuitry can include a battery negative contact 214, battery positive contact 215, and a battery jumper bar 216, which, when the battery unit cells are attached, connects the positive contact of the first unit cell (not shown) to the negative contact of the second unit cell (not shown) to connect the cells in series to form a two-cell battery. The circuitry can then be completed by, for example, printing leads from battery contacts 204 and 205 to match the locations of the antenna power source contacts 104 and 105 on the top side of the antenna substrate 110. These bottom side contacts 204 and 205 can be connected to the top side contacts 104 and 105 by means of the through holes 106 and 107 for the negative and positive contacts respectively.

Figure 2A:
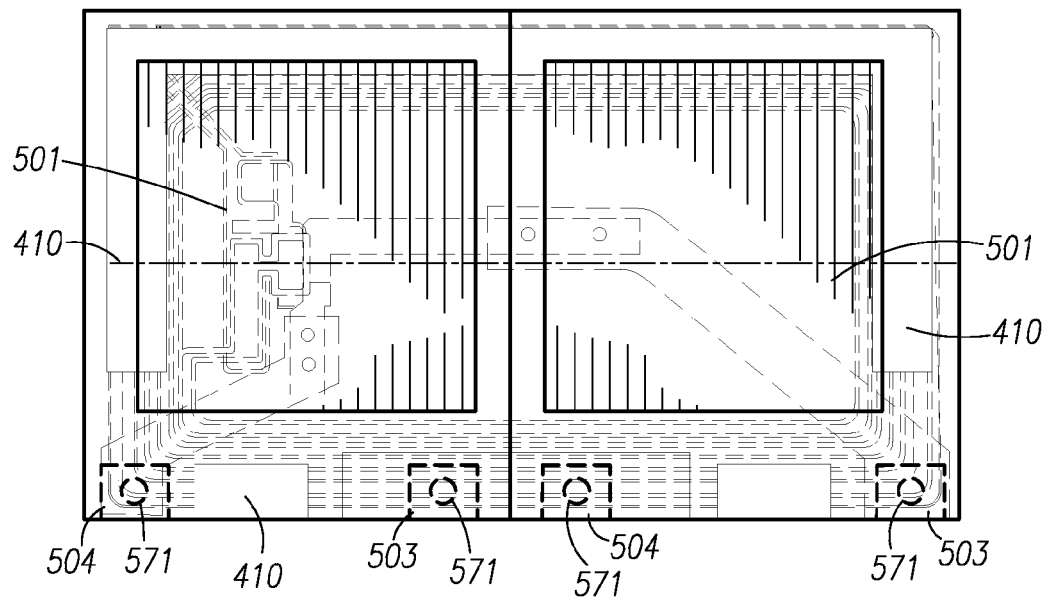
FIG. 2A Shows a drawing of the printed power source circuit on backside of foil antenna that is connected to a battery.

Such a battery sub-assembly can be seen in FIG. 2A, which shows a view of the backside of the antenna of FIGS. 1 and 2 using two unit cells 501 attached. This attachment can be done, for example, by the cells being physically attached to the substrate by means of pressure sensitive adhesive patterns 410 and electrically with the conductive adhesive drops 571 on the two negative contacts.

Figure 3:
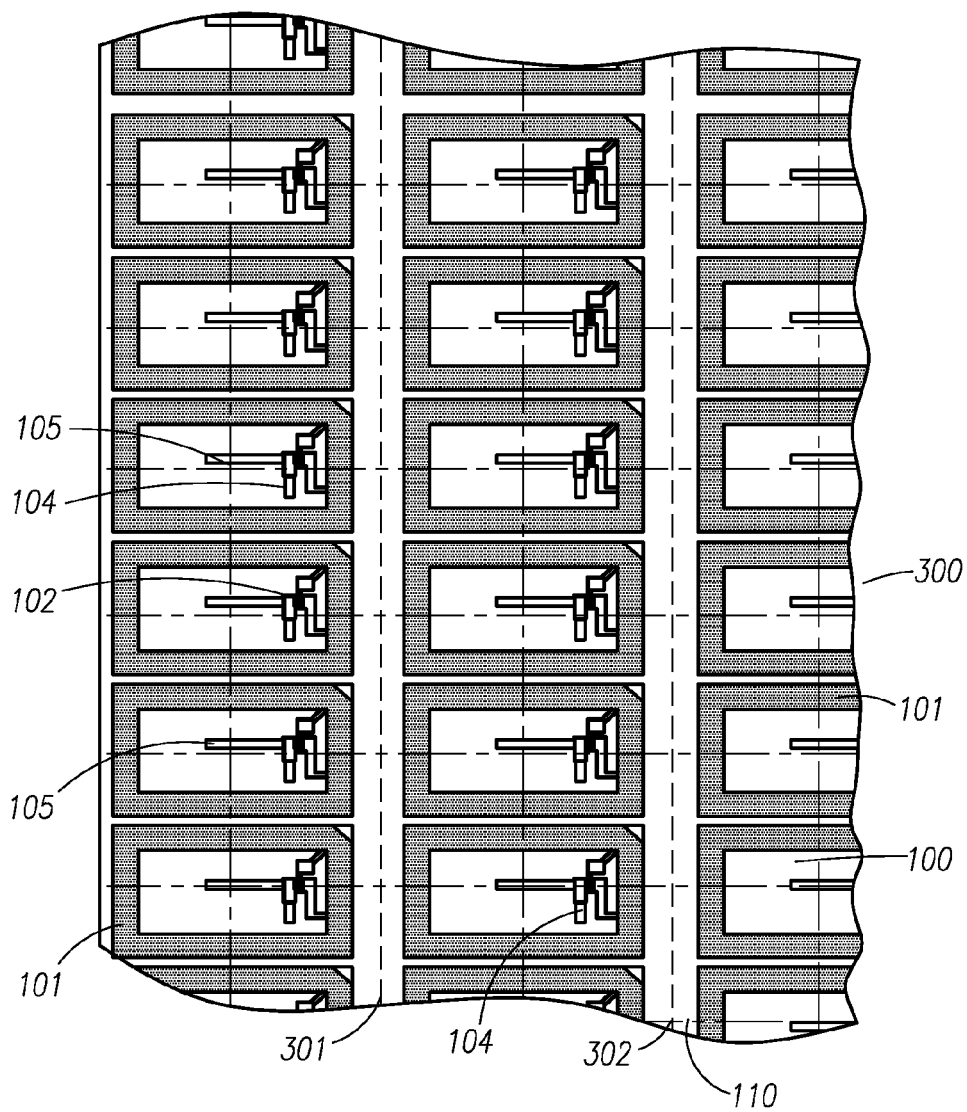
FIG. 3 Shows a drawing of a partial web from a roll of antennas on a substrate.

FIG. 3 shows a partial web 300 having a plurality of apparatuses 100, each on the top-side of substrates 110. These apparatuses include the coils 101, the chip 102, and the battery contacts 104 and 105. After the antennas 100 are provided on the top side of the web, the web can be turned over, and the power source circuitry 202 can be printed with a conductive ink, as shown in FIG. 2, on the backside of the web. Alternatively, a process that does not require that the web be turned over might be used, such as one that prepares both sides simultaneously, or nearly so.

Figure 4:
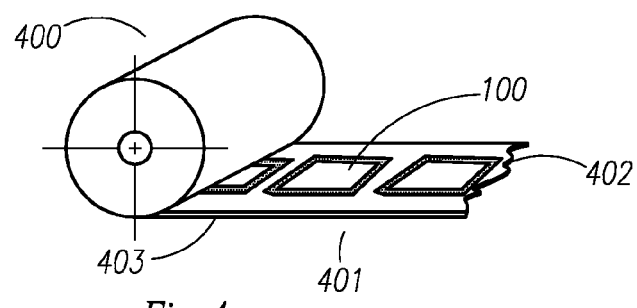
FIG. 4 Shows a drawing of a roll of antenna devices.

As shown in FIG. 2, to aid in the assembly operation a non-conductive pressure sensitive adhesive 402 can be pattern printed in a pattern at several locations on this web backside to allow for the antenna film to be bonded to the power source. A typical pattern 410 shown in FIG. 2 is dictated by the size and the shape of the bottom contacts as well as the size of the apparatus 100. As shown in FIG. 4, to allow for this web to be wound into a roll, a release liner 403 can be applied prior to the winding.

After this printing operation is completed, the rows of antennas can be slit along lines 301 and 302 and then each web 401 of antennas can be rewound into a roll 400, such as shown in FIG. 4 so that the antennas can then be assembled with the power source, if desired. FIG. 4 also shows the pressure sensitive adhesive 402 and its release liner 403.

Figure 5:
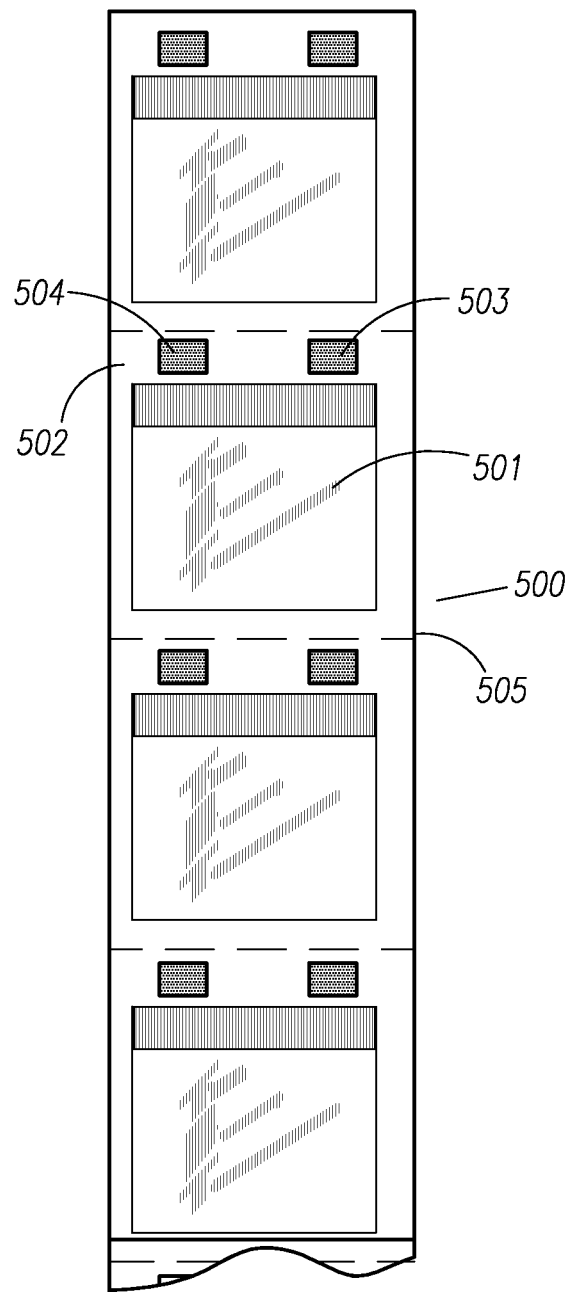
FIG. 5 Shows a drawing of a partial web from a roll of cells.

The power source for an example assembly device might be a 3 volt battery comprised of two 1.5 volt unit cells connected in series, for example, although other arrangements could be utilized for other applications (as discussed elsewhere herein). Acceptable unit cells for the power source for RFID labels of the example device include the thin flat cells described by the incorporated application references, for example, among others. FIG. 5 shows a battery comprised of a single flat thin unit cell 501 in a portion 500 of a roll of such cells. Some features of the exterior of the cells include a perimeter seal area 502, a positive contact 503, and a negative contact 504. Such a roll of cells could be made and assembled on a printing press, for example, or by using a printing press in combination with a pouch filling machine or similar type of filling machine, for example. After the cells were manufactured, they could be perforated at the top edge of the seal area at the top of one cell and at the bottom seal edge of the adjacent cell at line 505. This then allows the cells to be wound in a roll for ease of dispensing of a unit cell at a later date. For the method of the invention, the cells could be perforated or cut before the winding process as discussed above, or even after the unwinding process during the actual utilization of the cells, for example.

Figure 6:
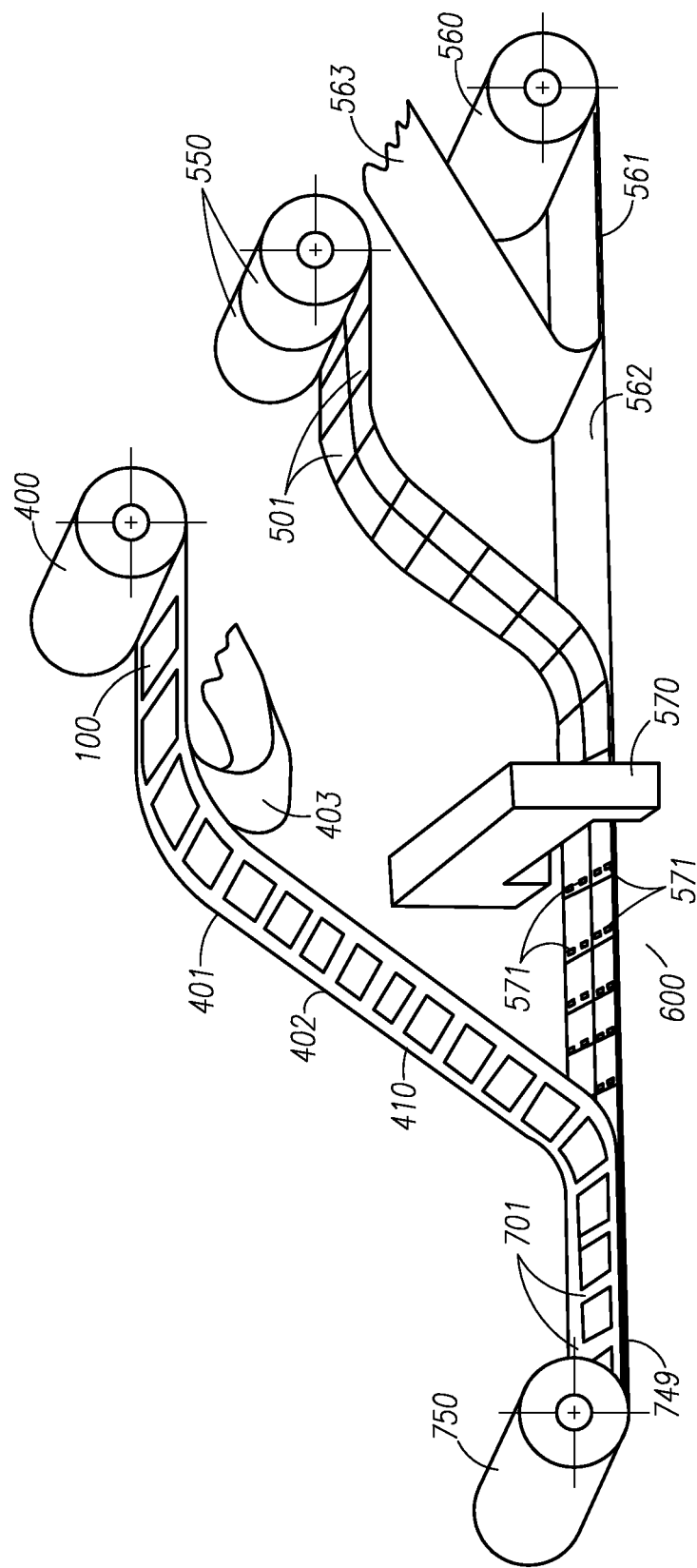
FIG. 6 Shows a drawing of an antenna/battery assembly process.

FIG. 6 shows a proposed process of one example manufacturing method of assembling a battery with an electrical apparatus such as, for example, a RFID antenna. This assembly process primarily includes laminating three different materials together along with some additional mechanical operations.

The assembly process 600 of the example method utilizes a roll 560 of a polymer film, such as a polyester, polyolefin etc. that acts as the assembly substrate. This substrate 561 can have a layer of pressure sensitive adhesive (PSA) 562 and its release liner 563. Also, depending on the ultimate use of this electronic assembly, a layer of PSA with its release liner could also be used on the bottom of substrate, thus making the assembly useful as an electronic label, for example.

The release liner 563 can be removed and the unit cells 501 can be laminated to the substrate 561, by means of PSA 562. Because the example application uses a 3 volt power supply, two 1.5 volt unit cells 501 connected in series are required for each application, and thus two rolls 550 of unit cells 501 can be laminated simultaneously to substrate 561 by means of pressure adhesive 562. Of course, a single roll having two cells side-by-side could also be used.

After the cells 501 are in place, a conductive adhesive 571 such as a conductive epoxy #5810 manufactured by Acheson Colloids or Emerson Cummings snap cure conductive adhesive #12873-32, or a pressure sensitive conductive adhesive can be dispensed from station 570 onto the cells 501. These adhesive drops 571 can be placed on the two cells four contacts which, when cured, will make electrical contact to the antenna assembly contacts 214, 215, and 216.

The antenna substrate can be structurally attached to the two cells by means of the pressure sensitive adhesive 402 that was previously applied in patterns 410. After these three layers are laminated together, they form a web 749 of apparatuses, such as the power source antenna assemblies of the example device. This web 749 can be perforated 701 on both sides of the assembly, thus allowing easy dispensing of unit assemblies onto packages or wherever they are used. Finally, this web can be wound into a roll 750 to facilitate their transport and use.

Figure 9:
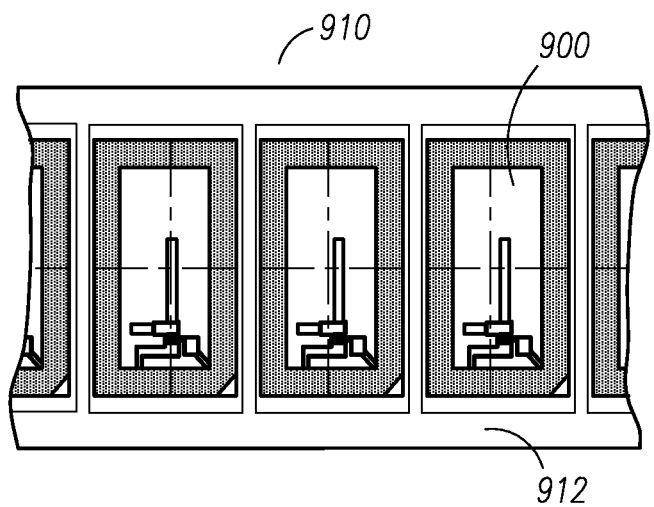
FIG. 9 Shows a drawing of a top view of web 910.
Figure 10:
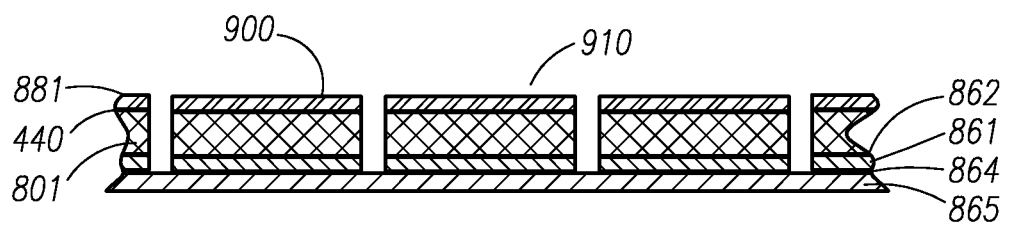
FIG. 10 Shows a drawing of a cross section of web 910.

Another option for such an assembly is to form it into a label for attaching to products, shipping boxes, etc. The discussion of FIG. 6 describes that the structural substrate 561 could have a pressure sensitive adhesive and liner on its bottom side. Such an example application where the end product is a label is shown in FIG. 9. Creating such labels 900 is possible using a bottom layer of pressure sensitive adhesive 864 and release liner 865, for example. Using a similar process as described in FIG. 6, the following paragraphs based on FIGS. 7-10 describes the example product and the process to make such an example electronic label.

Figure 7:
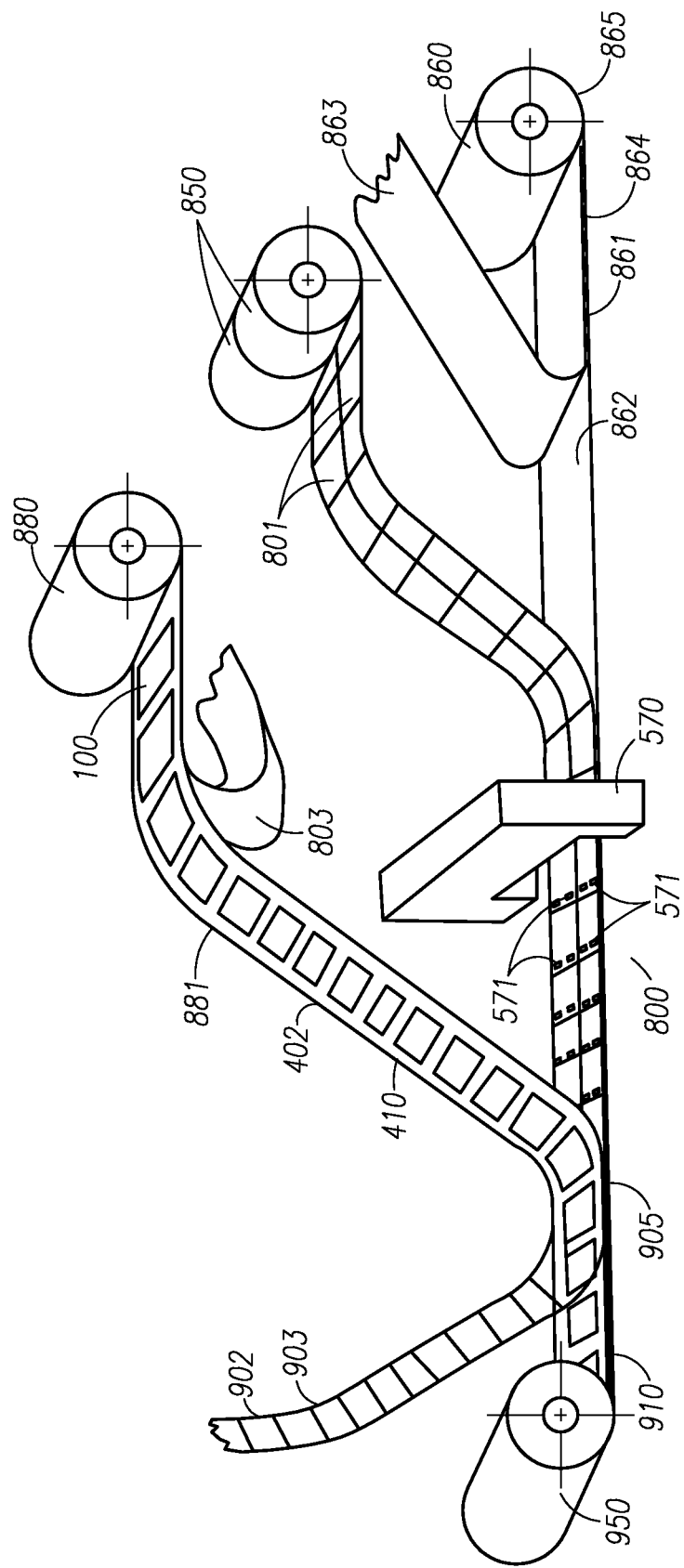
FIG. 7 Shows a drawing of an antenna/battery assembly process to make an electronic label.
Figure 8:
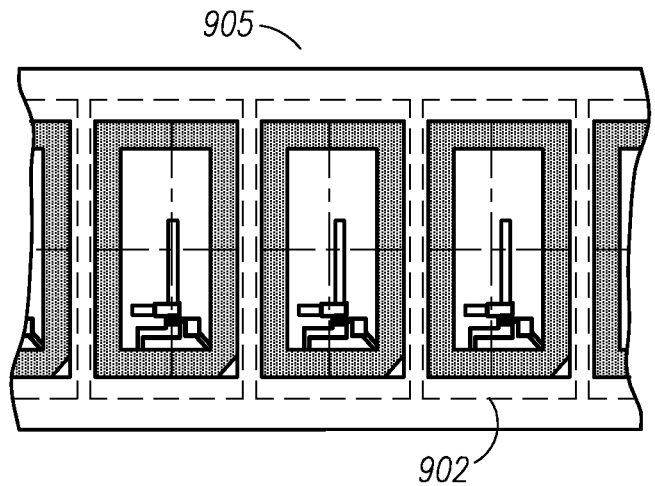
FIG. 8 Shows a drawing of a top view of web 905.

FIG. 7 shows the proposed process of assembling a battery with an electrical apparatus, but specifically a RFID antenna to make an electronic label 900. This assembly process includes laminating three different materials together along with some other mechanical operations. The assembly process 800 begins with a roll 860. This polymer film such as polyester, polyolefin etc acts as the assembly substrate, and could be wider to allow for die cutting of each individual antenna label than the substrate describe in the process of FIG. 6. This substrate 861 can include layer of pressure sensitive adhesive (PSA) 862 and its release liner 863. Also this electronic label can include a layer of PSA 864 with its release liner 865 on the bottom of substrate 861, thus making the assembly into an electronic label 900.

After the release liner 863 is removed, unit cells 801 can be laminated to the substrate 861 by means of PSA 862. Because this example application requires 3 volts, two 1.5 volt unit cells 801 are used for each application, thus two rolls 850 of unit cells 801 are laminated simultaneously to substrate 861 by means of PSA 862. As discussed above, a single roll of two side-by-side cells could also be used. These unit cells 801 can be made slightly wider than cells 501 and also slightly longer than cells 501 so that the label could be trimmed to a desired size at a later time.

After the cells 801 are in place, conductive adhesive drops 571, such as a conductive epoxy #5810 manufactured by Acheson Colloids, Emerson & Cummings snap cure conductive adhesive #12873-32 or a pressure sensitive conductive adhesive can be dispensed from station 570 onto the cells 801. These adhesive drops 571 can be placed on the two cells four contacts which, when cured, will make electrical contact to the antenna assembly contacts 214, 215, 216. This construction allows for this three-volt battery application to be assembled and electrically connected on the circuit, with two unit 1.5 volt cells, thus eliminating the need to make a special 3.0 volt battery.

The antenna substrate roll 880 and its web 881 can be made wider than the web 401 and the antennas 100 can be spaced further apart so that they could be trimmed to size with the entire label at a later time. The antennas can be structurally attached to the two cells 801 by means of the pressure sensitive adhesive 402 previously applied in patterns 410. After these three layers are laminated together, they form a web 905 shown in FIG. 8 of power source antenna assemblies.

The web 905 can be die cut with a size and geometry desired for the final electronic label 900 by using a kiss cut that allows the cut depth to be controlled. The depth can be chosen to include cutting through the following layers, for example: antenna web 881, pressure sensitive adhesive 410, unit cells 801, pressure sensitive adhesive 862, substrate 861, and pressure sensitive adhesive 864, but typically not through release liner 865. This allows for the electronic label to remain on release liner 865 as well as permits the web matrix 902 to be removed and discarded.

Matrix 902 includes the extra web 903 and the holes 904 in this web from where the die cut label 900 was removed. Finally this web 910 can be wound into roll 950 to facilitate their transport and use, thus allowing easy dispensing of unit assembly labels 900 onto packages with a standard labeling machine, for example.

Another process that could make a similar assembly but might require fewer operations and materials is described next. The starting point for such a process uses the rolls of antennas 880 as detailed in FIGS. 1-4, 8, 9, and 10. After the antennas are etched or printed on the top side as shown in FIG. 1, this surface can be printed or coated with a solvent based or UV cured pressure sensitive adhesive, for example.

Figure 11:
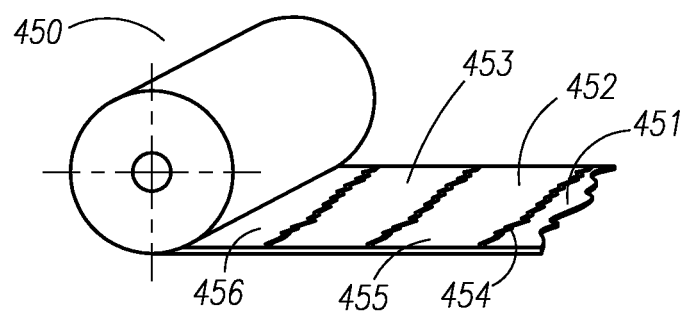
FIG. 11 Shows a drawing of a top view, bottom view and web section of antenna roll 450.

After drying and/or curing of the PSA, a release liner is applied so that the roll of antennas 450 could be wound as shown in FIG. 11. FIG. 11 shows the details of both the top layer 455 and bottom layer 454 and the orientation of the layers. The bottom layer of roll 450 is the PSA release liner 451, the next layer up is the pressure sensitive adhesive layer 452 that was applied to the bottom of the antenna substrate layer 453. In previous discussions, this layer was on top of the roll, in this application, this surface now becomes the bottom surface 454 and is further processed.

On the top side of this substrate 455 the battery contacts 204, 205 along with the PSA patterns 410 are printed. After these printing operations are completed, a release liner 456 could be added prior to winding the roll, or the web could be further processed to complete the assembly operations.

Figure 12:
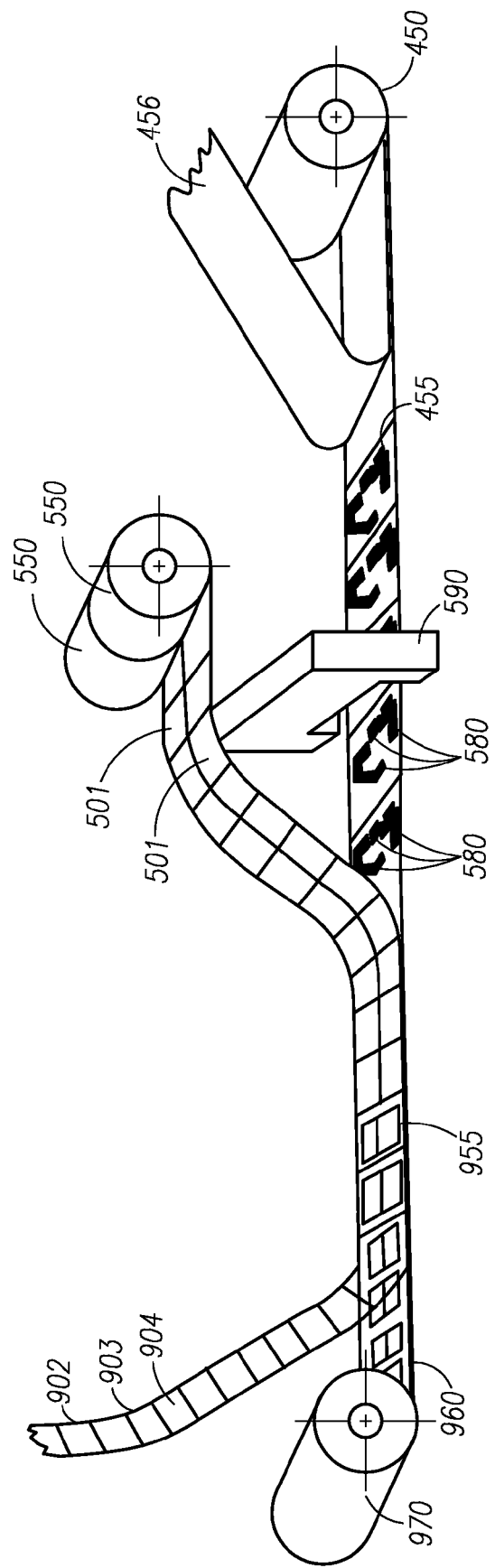
FIG. 12 Shows a drawing of an Antenna/battery assembly process to make an electronic label.

FIG. 12 depicts the method of two stages. After the printing is completed, roll 450 is unwound and the top release liner 456 is removed. Two rolls 550 of unit cells 501 are unwound from the opposite side as described in the example of FIG. 6. In this operation the cell front is facing down as shown in FIG. 12. Prior to attaching unit cells 801 to antenna surface 455, conductive adhesive drops 580 are dispensed from dispenser 590 on to the top of antenna/battery contacts 214, 215 and 216. These adhesive drops match the four cell contacts from the two unit cells 501.

The antenna substrate roll 450 and its web 453 are wider than the web 401 and the antennas 100 are spaced further apart so that they could be trimmed to size with the entire label at a later time. The antennas are structurally attached to the two cells 501 by means of the pressure sensitive adhesive 402 that was previously applied in patterns 410. After these three layers are laminated together, they form a web 955 of power source antenna assemblies.

This web 955 can be die cut with a size and geometry of the final electronic label 960 using a kiss cut that allows the cut depth to be controlled, for example. The cutting depth typically includes cutting through the following layers: unit cells 501, pressure sensitive adhesive 410, antenna substrate 453, pressure sensitive adhesive 452, but not through release liner 451. This allows for the electronic label to remain on release liner 451 as well as permitting the web matrix 902 to be removed and discarded. Matrix 902 consists of the extra web 903 and the holes 904 in this web from where the die cut label 960 was removed. Finally this web 910 can be wound into roll 970 to facilitate their transport and use, thus allowing easy dispensing of unit assembly labels 960 onto packages with a standard labeling machine, for example.

The invention has been described hereinabove using specific examples of the embodiments and examples of the manufacturing processes; however, it will be understood by those skilled in the art that various alternatives may be used and equivalents may be substituted for elements and/or steps described herein, whether disclosed or not, without deviating from the scope of the invention. Modifications may be necessary to adapt the invention to a particular situation or to particular needs without departing from the scope of the invention. It is intended that the invention not be limited to the particular implementations and embodiments described herein, but that the claims be given their broadest interpretation to cover all embodiments, literal or equivalent and whether disclosed or not.

What is claimed is:

1. An electrical device comprising:
    an electrical apparatus including:
        an apparatus substrate having a first side and an opposite second side,
        an active electrical component provided on said first side of said apparatus substrate,
        a flexible flat battery fixedly connected to said opposite second side of said apparatus substrate, wherein said battery is for providing electrical energy to said active electrical component,
        a first electrical contact electrically connected to said active electrical component and printed on said second side of said apparatus substrate, and
        a second electrical contact electrically connected to said active electrical component and printed on said second side of said apparatus substrate;
    wherein said flexible flat battery including at least one electrochemical cell including a printed electrochemical layer comprising a cathode layer including a first dried or cured ink, and an additional electrochemical layer comprising an anode layer located adjacent to said printed electrochemical layer,
        wherein both said printed electrochemical layer and said additional electrochemical layer are each at least partially covered by a same liquid electrolyte layer in contact with both said printed electrochemical layer and said additional electrochemical layer, and
        wherein both of the cathode layer and anode layer are provided on a same battery substrate layer such that the cathode layer and the anode layer are thereby arranged substantially co-planar,
    said battery having a first side and a second side, with said first side of said battery fixedly connected to said second side of said apparatus substrate, said battery further including:
        a first electrode contact printed on said second side of said apparatus substrate and connected to said first electrical contact, and
        a second electrode contact printed on said second side of said apparatus substrate and connected to said second electrical contact;
    wherein said first and second electrode contacts are each connected to a selected one of the electrochemical layer and additional electrochemical layer of the electrochemical cell.

2. The electrical device of claim 1, wherein said flat battery is comprised of at least two electrochemical cells connected in series.

3. The electrical device of claim 1, wherein said printed electrochemical layer being printed on a collector layer including a second dried or cured ink, said collector layer being printed on said battery substrate layer.

4. The electrical device of claim 3, wherein said battery substrate layer is comprised of a plurality of layers laminated together.

5. The electrical device of claim 1, wherein said additional electrochemical layer is a strip including zinc that is laminated to said battery substrate layer.

6. The electrical device of claim 1, wherein said electrical component includes an RFID antenna.

7. The electrical device of claim 6, wherein said flexible substrate includes a second adhesive on an outer layer such that said electrical device can be applied to a surface as a label using said second adhesive.

8. A roll including a plurality of the electrical devices as defined in claim 7, wherein said plurality of said electrical devices are provided with said flexible substrate of each of said devices connected together in a linear web that are formed into said roll.

9. The apparatus of claim 1, wherein said battery is fixedly connected to said second side of said apparatus substrate using an intermediate adhesive.

10. The electrical device of claim 1, wherein said electrical component includes an RFID antenna.

11. The electrical device of claim 10, wherein said device substrate includes a second adhesive on an outer layer such that said electrical device can be applied to a surface as a label using said second adhesive.

12. A roll including a plurality of the electrical devices as defined in claim 11, wherein said plurality of electrical devices are provided with said flexible substrate of each of said devices connected together in a linear web that are formed into said roll.

13. A device having one of said electrical devices removed from the roll of claim 12 applied thereon.

14. The electrical device of claim 1, wherein one or both of:
    said first electrode contact is connected to said first electrical contact via a first conducting adhesive; and
    said second electrode contact is connected to said second electrical contact via a second conducting adhesive.

15. A roll including a plurality of the electrical devices as defined in claim 1, wherein said plurality of electrical devices are provided with said flexible substrate of each of said devices connected together in a linear web that are formed into said roll.

16. The electrical device of claim 1, wherein said flat battery is comprised of a single electrochemical cell.

17. The electrical device of claim 1, wherein said flat battery is comprised of at least two electrochemical cells connected in parallel.

18. An electrical device comprising:
    an apparatus substrate having a first side and an opposite second side,
    an active electrical component provided on said first side of said apparatus substrate,
    a flexible flat battery fixedly connected to said opposite second side of said apparatus substrate, wherein said battery is for providing electrical energy to said active electrical component,
    wherein said flexible flat battery includes:
        at least one electrochemical cell including a printed electrochemical layer comprising a cathode layer including a first dried or cured ink, and
        an additional electrochemical layer comprising an anode layer located adjacent to said printed electrochemical layer,
            wherein both said printed electrochemical layer and said additional electrochemical layer are each at least partially covered by a same liquid electrolyte layer in contact with both said printed electrochemical layer and said additional electrochemical layer, and wherein both of the cathode layer and anode layer are provided on a same battery substrate layer such that the cathode layer and the anode layer are thereby arranged substantially co-planar;

first and second electrical contacts electrically connected to said active electrical component and printed on said second side of said apparatus substrate;

first and second electrode contacts also printed on said second side of said apparatus substrate and connected to said first and second electrical contacts, respectively, wherein said first and second electrode contacts are each connected to a selected one of the electrochemical layer and additional electrochemical layer of the electrochemical cell so that electrical energy from the battery is provided to the active electrical component via the first and second electrical contacts.

19. The electrical device of claim 1, wherein said additional electrochemical layer includes a dried or cured ink.

20. The electrical device of claim 18, wherein said additional electrochemical layer includes a dried or cured ink.

* * * * *